(12) United States Patent
Koh

(10) Patent No.: US 7,244,679 B2
(45) Date of Patent: Jul. 17, 2007

(54) METHODS OF FORMING SILICON QUANTUM DOTS AND METHODS OF FABRICATING SEMICONDUCTOR MEMORY DEVICES USING THE SAME

(75) Inventor: Kwan-Ju Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/914,994

(22) Filed: Aug. 10, 2004

(65) Prior Publication Data

US 2005/0037631 A1    Feb. 17, 2005

(30) Foreign Application Priority Data

Aug. 12, 2003 (KR) .................. 10-2003-0055787

(51) Int. Cl.
*H01L 21/311* (2006.01)
(52) U.S. Cl. ................. 438/694; 438/695; 438/719
(58) Field of Classification Search ......... 438/694, 438/695, 719, 738, 742
See application file for complete search history.

(56) References Cited

U.S. PATENT DOCUMENTS

| 5,347,140 | A   |   | 9/1994  | Hirai et al. |
| 5,731,598 | A   |   | 3/1998  | Kado et al. |
| 6,033,967 | A   | * | 3/2000  | Li et al. ............... 438/398 |
| 6,060,743 | A   | * | 5/2000  | Sugiyama et al. ........ 257/321 |
| 6,090,666 | A   |   | 7/2000  | Ueda et al. |
| 6,118,686 | A   |   | 9/2000  | Taira et al. |
| 6,130,143 | A   |   | 10/2000 | Westwater et al. |
| 6,597,036 | B1  |   | 7/2003  | Lee et al. ................ 257/316 |
| 6,734,105 | B2  | * | 5/2004  | Kim ...................... 438/694 |
| 6,767,771 | B2  |   | 7/2004  | Kim |
| 2005/0003620 | A1 | * | 1/2005  | Ko ....................... 438/297 |

* cited by examiner

*Primary Examiner*—Hsien-Ming Lee
(74) *Attorney, Agent, or Firm*—Andrew D. Fortney

(57) ABSTRACT

Techiques for forming a silicon quantum dot, which can be applied to the formation of a semiconductor memory device, are disclosed. The techniques may include depositing a first dielectric layer on a semiconductor substrate, depositing a polysilicon layer on the first dielectric layer, forming a plurality of metal clusters on the polysilicon layer in regular distance, and etching the polysilicon layer using the plurality of metal clusters as a mask. As disclosed herein, it is possible to form the silicon quantum dots having the fineness and uniformity characteristic together with the single crystalline level characteristic.

3 Claims, 2 Drawing Sheets

METHODS OF FORMING SILICON QUANTUM DOTS AND METHODS OF FABRICATING SEMICONDUCTOR MEMORY DEVICES USING THE SAME

TECHNICAL FIELD

The present disclosure pertains to semiconductor fabrication and, more particularly, to methods of forming a silicon quantum dots and method for fabricating semiconductor memory devices using the same.

BACKGROUND

Recently, as the integration level of semiconductor devices has increased, it has been estimated that the metal oxide semiconductor (MOS) structure that was used, until now, for basic switching devices, has reached its useful limit. In one example case of using the MOS structure, a gap between a source and a drain will become narrow in highly integrated devices such as 4 gigabyte (GB) dynamic random access memory (DRAM), such that the switching function performed by the MOS gate voltage, which is a principle for driving the MOS device, will not work. That is, at high levels of integration, even when the gate voltage is not applied to a MOS device, tunneling effects will occur between the MOS source and drain and through a gate oxide layer, resulting in malfunctioning of the MOS device. For this reason, the integration limit of the MOS structure will be about 4 GB DRAM. Accordingly, to fabricate devices in the gigabyte range and to integrate devices in the even denser terabyte range, another structure rather than the conventional MOS structure should be adopted. One of the device structures identified as an alternative to the MOS structure is a Single Electron Transistor (SET), which has been proposed by many research groups.

The SET is device that operates using a so called Coulomb blockade effect for controlling flows of individual electrons by suppressing the tunneling of electric charges while charge carriers such as electrons or holes passing a dielectric layer among many quantum mechanic phenomena caused by interactions of the electrons in nanoscale.

The Coulomb blockade effect of the single electron tunneling can be explained as follows. When the entire capacitance is very low by a region to which the electrons input through the tunneling effect, it is possible to observe the discrete electric charging of the electrons. If the energy $e^2/2c$ charged by the discrete electric charging is greater than an energy (kBT) generated by the thermal vibration and there is no voltage increase applied from outside, it is difficult to obtain the energy for charging the capacitor with electrons through the tunneling at that temperature. Accordingly, the electron tunneling does not proceed after a single electron is charged. That is, the previous tunneled electron charges the capacitor such that the next electron is given the low voltage as much as a voltage drop at the capacitor, whereby the energy for charging the capacitor through the tunneling become insufficient, which has the result of stopping the tunneling. Such an effect in which a previously tunneled electron blocks subsequent tunneling is called the Coulomb blockade effect.

Typically, the SET structure using the Coulomb blockade effect provides a channel including a conductive quantum dot, which enables the discrete flow of electrons with the identical source, drain, and gate structures. Accordingly, the channel consists of dielectric material and quantum dots so as to enable the electron to flow through the quantum dot by the discrete tunneling.

To fabricate a nanoscale device using quantum dots, it is required to develop techniques capable of forming a fine and uniform quantum dot having single crystalline characteristic. In the art of forming the quantum dot, typically, methods for forming the quantum dot include typical lithography techniques and include depositing the silicon oxide ($SiO_2$) under excess condition of the silicon level.

The U.S. Pat. Nos. 6,597,036 and 6,060,743 have disclosed a method for forming a gate of a transistor using the quantum dots and a method for forming the quantum dot by moving a reactive atom using a beam or core formation method, respectively.

DETAILED DESCRIPTION

Figure 1:
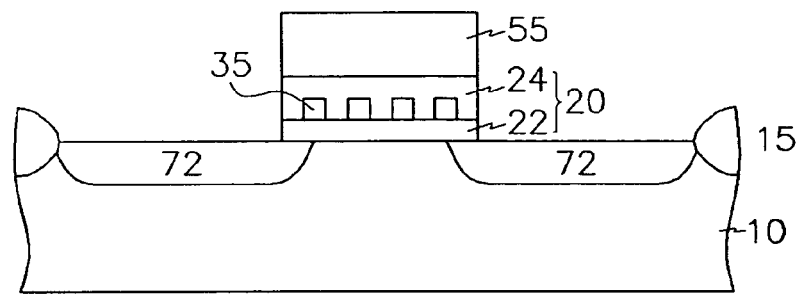
FIG. 1 is a cross-sectional view schematically illustrating an example semiconductor memory device as disclosed herein.

To clarify multiple layers and regions, the thickness of the layers are enlarged in the drawings. Wherever possible, the same reference numbers are used throughout the drawings to refer to the same or like parts. When it is said any part such as a layer, film, area, or plate is positioned "on another part," it means the part is right on the other part or above the other part with at least one intermediate or intervening part. Additionally, when it is said that any part is positioned "right on" another part, this means that there is no intermediate or intervening part between the two parts.

As shown in FIG. 1, the semiconductor memory device includes a gate dielectric layer 20 formed by a silicon oxide layer on a partial region of an active region of a semiconductor substrate 10 and is provided with a plurality of quantum dots formed from polysilicon. On the gate dielectric layer, a control gate 35 of a conductive material is formed.

Below the control gate 35, source/drain regions 72 are formed on the semiconductor substrate 10 such that the control gate 35 is interposed between the source/drain regions 72. Here, the source/drain regions 72 are partially overlapped with the control gate 35 at its low part.

The silicon quantum dots are form using metal clusters formed on the polysilicon layer as a mask. Using these silicon quantum dots, the nanoscale semiconductor device can be fabricated.

One method of fabricating the semiconductor memory device depicted in FIG. 1 is described hereinafter with reference to FIG. 2A to FIG. 2E, which are cross-sectional views illustrating semiconductor devices at various stages of fabrication according to the disclosed techniques.

Figure 2A:
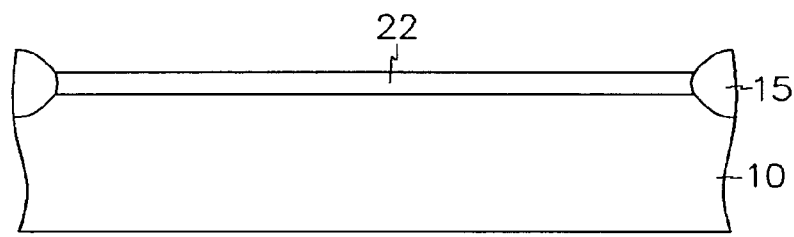
FIG. 2A to FIG. 2E are cross-sectional views illustrating example semiconductor devices as various fabrication stages that are used to produce a semiconductor device as disclosed herein.

As shown in FIG. 2A, a device isolation layer 15 is formed on the semiconductor 10 to define an active region and an inactive region. A first dielectric layer 22 of oxide is then formed on the active region.

Figure 2B:
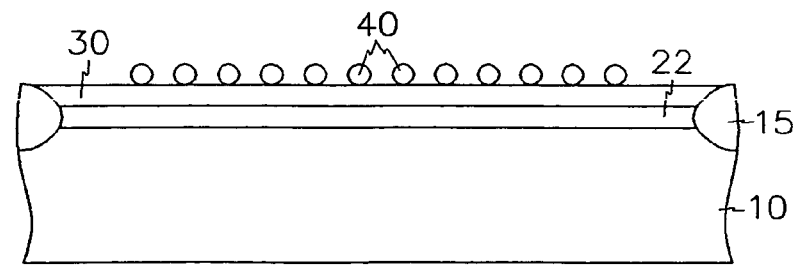

Subsequently, as shown in FIG. 2B, a quantum dot formation layer 30 of polysilicon is formed on the first dielectric layer 22. The quantum dot formation layer 30 may have a thickness in the range of a few to dozens nanometers (nm). In one particular example, the thickness of the quantum dot formation layer 30 is in the range from 10 to 100 nm.

After formation of the quantum dot formation layer 30, a plurality of metal clusters 40 formed on the quantum dot formation layer 30. The metal clusters 40 are formed by depositing a metal such as gold, silver, or other potential metal using a vapor deposition and massing the metal in nanoscale size without combining the metal with the silicon. In one example, the metal clusters 40 are arranged with a regular distance or spacing between each other and the size of the metal clusters 40 increases in proportion to the deposition amount. In one example, the metal clusters 40 are formed such that their diameters are less than 10 nanometers when the thickness of the quantum dot formation layer 30 is a few Angstroms (Å).

Figure 2C:
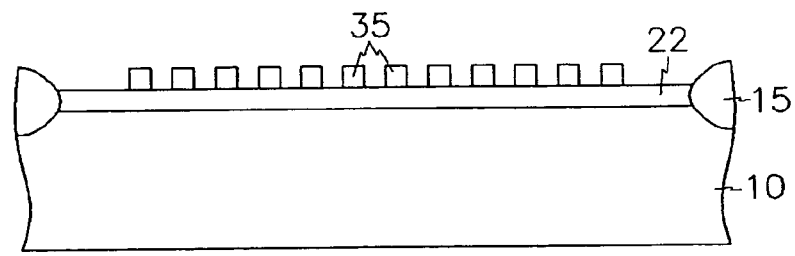

As shown in FIG. 2C, a plurality of silicon quantum dots 35 are formed by etching the quantum dot formation layer 30 using, for example, a dry etching technique in which the metal cluster 40 form a mask for the etching. After the silicon quantum dots 35 are formed, the plural metal clusters 40 are removed using the wet and/or dry etching.

Figure 2D:
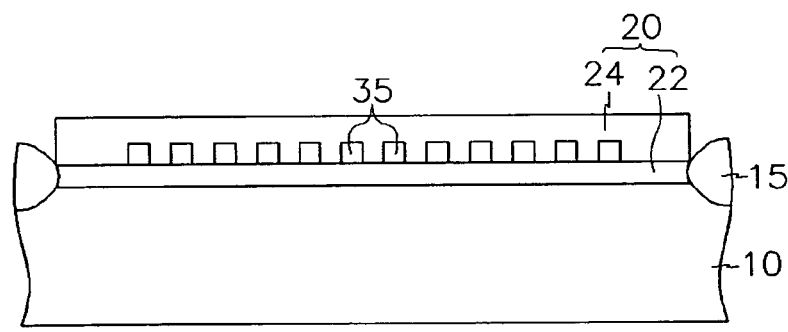

Subsequently, as shown in FIG. 2D, a second gate dielectric layer 24 of the oxide is deposited on the first gate dielectric layer 22 so as to cover the silicon quantum dots 35, thereby forming a gate dielectric layer 20 including the quantum dots 35.

Figure 2E:
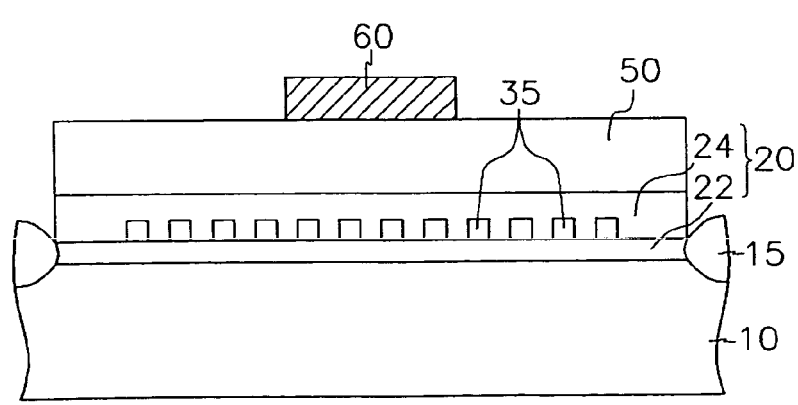

Next, as shown in FIG. 2E, a control gate formation layer 50 is formed on the second gate dielectric layer 24 by depositing polysilicon. A photoresist film pattern 60 for defining a control gate area is formed on the control gate formation layer 50. Subsequently, the control gate formation layer 50 is formed by exposing and developing the photoresist film 60.

Consequentially, as shown in FIG. 1, the control gate 55 of polysilicon is formed through an etching process using the photoresist film pattern 60 as a mask.

As described above, the silicon quantum dots 35 are formed using the plural metal clusters 40 as a mask. The silicon quantum dots 35 are formed in a nanoscale size with regular spacing intervals between one another. It is possible to form the silicon quantum dots having the fineness and uniformity characteristic together with the single crystalline level characteristic.

Techniques for forming for forming a silicon quantum dot having fine and uniform characteristics together with a crystalline characteristic at a single crystal level are disclosed herein. Also disclosed herein is a nanoscale semiconductor memory device using the silicon quantum dot.

As disclosed herein techniques for forming the silicon quantum dots include depositing a first dielectric layer on a semiconductor substrate, depositing a polysilicon layer on the first dielectric layer, forming a plurality of metal clusters on the polysilicon layer in regular distance, and etching the polysilicon layer using the metal clusters as a mask. According to one example, the metal clusters are formed out of one of a gold, a silver, or a transition metal.

As also disclosed herein, a method for fabricating a semiconductor memory device using the silicon quantum dots includes defining an active region and non-active region using a device isolation layer formed on a semiconductor substrate, deposition a first dielectric layer on the active region, depositing a polysilicon layer on the first dielectric layer, and forming a plurality of metal clusters on the polysilicon layer in a regular distance. The method also includes forming silicon quantum dots by etching the polysilicon layer using the metal clusters as a mask, removing the metal clusters, depositing a second dielectric layer on the silicon quantum dots, forming a conductive layer for electrodes on the second electric layer, and selectively removing the conductive layer and the first and second dielectric layers selectively. In one example, the polysilicon layer is etched using the metal clusters as a mask through a dry etching process.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for fabricating a semiconductor memory device comprising:
    defining an active region and non-active region using a device isolation layer formed on a semiconductor substrate;
    depositing a first dielectric layer on the active region;
    depositing a polysilicon layer on the first dielectric layer;
    forming a plurality of metal clusters on the polysilicon layer;
    forming separated silicon quantum dots by etching the polysilicon layer using the plurality of metal clusters at regular intervals as a mask until a top surface of the first dielectric layer is exposed;
    removing the plurality of metal clusters;
    depositing a second dielectric layer on the separated silicon quantum dots;
    forming a conductive layer for gate electrodes on the second electric layer; and
    removing the conductive layer and the first and second dielectric layers selectively.

2. The method as defined by claim 1 wherein each of the plurality of metal clusters comprises gold, silver, or a transition metal.

3. The method as defined by claim 1 wherein the polysilicon layer has a thickness in the range of 10 to 100 nanometers.

* * * * *